US010660159B2

(12) United States Patent
Bouchiat et al.

(10) Patent No.: US 10,660,159 B2
(45) Date of Patent: May 19, 2020

(54) TRANSPARENT HEATING DEVICE WITH GRAPHENE FILM

(71) Applicants: CENTRE NATIONAL DE LA RECHERCHE SCIENTIFIQUE, Paris (FR); UNIVERSITE GRENOBLE ALPES, Saint Martin d'Heres (FR)

(72) Inventors: Vincent Bouchiat, Biviers (FR); Laetitia Marty, Quaix en Chartreuse (FR); Nedjma Bendiab, Grenoble (FR)

(73) Assignees: CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 33 days.

(21) Appl. No.: 15/521,888

(22) PCT Filed: Oct. 23, 2015

(86) PCT No.: PCT/EP2015/074672
§ 371 (c)(1),
(2) Date: Apr. 25, 2017

(87) PCT Pub. No.: WO2016/062885
PCT Pub. Date: Apr. 28, 2016

(65) Prior Publication Data
US 2017/0318625 A1   Nov. 2, 2017

(30) Foreign Application Priority Data
Oct. 24, 2014   (EP) .................... 14306699

(51) Int. Cl.
*H05B 3/14*     (2006.01)
*H05B 3/00*     (2006.01)
(Continued)

(52) U.S. Cl.
CPC ........... *H05B 3/145* (2013.01); *H01L 51/529* (2013.01); *H05B 1/0233* (2013.01);
(Continued)

(58) Field of Classification Search
CPC .. H01L 51/529; H05B 3/145; H05B 2203/007
See application file for complete search history.

(56) References Cited

U.S. PATENT DOCUMENTS

| 2002/0015824 A1 | 2/2002 | Kawamoto et al. |
| 2006/0201933 A1 | 9/2006 | Carpino, II et al. |

(Continued)

FOREIGN PATENT DOCUMENTS

| DE | 102010038079 A1 | | 4/2012 |
| DE | 102010038079 A1 | * | 12/2012 |
| EP | 1168888 A1 | | 1/2002 |

OTHER PUBLICATIONS

Junrno Kang "High-Performance Graphene-Base Transparent Flexible Heaters" https://pubs.acs.org/doi/pdfplus/10.1021/nl202311v.*
(Continued)

*Primary Examiner* — Kenneth Parker
*Assistant Examiner* — Long H Le
(74) *Attorney, Agent, or Firm* — Young & Thompson

(57) ABSTRACT

The invention concerns a transparent heating device comprising: a graphene film fixed to a transparent substrate; a first electrode (205) connected to a first edge of the graphene film; and a second electrode (206) connected to a second edge of the graphene film, wherein there is a resistance gradient across the graphene film from the first electrode (205) to the second electrode (206).

19 Claims, 4 Drawing Sheets

(51) Int. Cl.
*H05B 3/84* (2006.01)
*H01L 51/52* (2006.01)
*H05B 1/02* (2006.01)
*B60S 1/02* (2006.01)

(52) U.S. Cl.
CPC ......... *H05B 3/0004* (2013.01); *H05B 3/0014* (2013.01); *H05B 3/84* (2013.01); *B60S 1/026* (2013.01); *H05B 2203/007* (2013.01); *H05B 2203/011* (2013.01); *H05B 2203/013* (2013.01); *H05B 2203/017* (2013.01); *H05B 2203/037* (2013.01); *H05B 2214/04* (2013.01)

(56) References Cited

U.S. PATENT DOCUMENTS

| | | | |
|---|---|---|---|
| 2013/0285092 A1* | 10/2013 | Wei | H01L 33/46 |
| | | | 257/98 |
| 2014/0017444 A1* | 1/2014 | Shimizu | G02F 1/13439 |
| | | | 428/131 |
| 2017/0125320 A1* | 5/2017 | Sung | C01B 32/194 |

OTHER PUBLICATIONS

Junnno Kang "High-Performance Graphene-Base Transparent Flexible Heaters" https://pubs.acs.org/doi/pdfplus/10.1021/nl202311v.*
J. Kang et al.: "High-Performance Graphene-Based Transparent Flexible Heaters", NANO Letters, vol. 9, Nov. 14, 2011 (Nov. 14, 2011), pp. 5154-5158, XP002733687, cited in the application the whole document.
European Patent Office, International Search Report for PCT/EP2015/074672, dated Feb. 2, 2016.

* cited by examiner

TRANSPARENT HEATING DEVICE WITH GRAPHENE FILM

CROSS-REFERENCE TO RELATED APPLICATIONS

The present application is a National Stage of PCT International Application Serial Number PCT/EP2015/074672, filed Oct. 23, 2015, and claims priority under 35 U.S.C. § 119 of European Patent Application Serial Number 14306699.1, filed Oct. 24, 2014, the disclosures of which are incorporated by reference herein.

BACKGROUND

For certain applications, such as for windscreens or wing mirrors for motor vehicles, it would be desirable to provide a transparent heating device in the form of a transparent element that is capable of conducting an electrical current across its surface. Thus, by applying a voltage to electrodes at the edges of the transparent element, the transparent element may be heated. In the case of windscreens or wing mirrors, such a heating device can be used to remove and/or prevent the build-up of frost.

Indium tin oxide (ITO) is a material that, when applied in thin layers, provides a transparent conducting layer. However, ITO has a number of drawbacks. In particular, it is a relatively brittle material, making it unsuitable for surfaces that may flex during use. Furthermore, Indium is in short supply, making ITO relatively costly.

One alternative to ITO that has been proposed is graphene. Graphene is a material composed of carbon atoms forming a crystal lattice one atom in thickness. It is conductive, transparent, and flexible and can be produced at relatively low cost. For example, the publication by J. Kang et al. entitled "High-Performance Graphene-Based Transparent Flexible Heaters", Nano Letters, 3b2, version 9, pages 5154 to 5158, Nov. 14, 2011, describes a flexible transparent heater based on a large-scale graphene film synthesized by chemical vapor deposition on a Cu foil.

However, there is a technical problem in providing a transparent heating device comprising graphene that has a relatively uniform thermal emission across its surface.

Furthermore would also be desirable in some embodiments to be able to display information on the transparent heating device, however there are technical problems in doing so.

SUMMARY

It is an aim of embodiments of the present disclosure to at least partially address one or more problems in the prior art.

According to one aspect, there is provided a transparent heating device comprising: a graphene film fixed to a transparent substrate; a first electrode connected to a first edge of the graphene film; and a second electrode connected to a second edge of the graphene film, wherein there is a resistance gradient across the graphene film from the first electrode to the second electrode.

According to one embodiment, the graphene film comprises a first region adjacent to the first electrode and at least one further region, the first region being adapted to have a lower resistance per square than each of the at least one further regions. For example, the graphene film comprises areas of reduced thickness and/or absence of graphene, the lower resistance per square in the first region with respect to the at least one further region resulting from the surface area and/or thickness of said areas of reduced thickness and/or absence of graphene.

According to one embodiment, the at least one further region comprises openings formed in one or more graphene mono-layers of the graphene film.

According to one embodiment, the first region comprises openings formed in one or more graphene mono-layers of the graphene film, and the density of openings is greater in the at least one further region than in the first region.

According to one embodiment, the first region comprises a plurality of graphene mono-layers, and the at least one second region comprises fewer graphene mono-layers than the first region.

According to a further aspect, there is provided a transparent heating device comprising: a graphene film fixed to a transparent substrate; a first electrode connected to a first edge of the graphene film; a second electrode connected to a second edge of the graphene film, wherein there is a resistance gradient across the graphene film from the first electrode to the second electrode, the graphene film comprising a first region adjacent to the first electrode and at least one further region, the first region being adapted to have a lower resistance per square than each of the at least one further regions; and one or more gate electrodes positioned in the at least one further regions and isolated from the graphene film by an insulating layer, a voltage applied to the one or more gate electrodes increasing the resistance per square of the graphene film in the at least one further regions.

According to one embodiment, each of the one or more gate electrodes has a surface area of at least 1 $cm^2$.

According to one embodiment, the transparent heating device comprises a plurality of the further regions, a first of the gate electrodes being positioned in a first of the further regions and a second of the gate electrodes being positioned in a second of the further regions.

According to one embodiment, the transparent heating device further comprises a control circuit adapted to apply a first voltage to the first gate electrode and a second voltage different from the first voltage to the second gate electrode.

According to one embodiment, the transparent heating device further comprises a display comprising one or more light emitting elements each having a pair of electrodes, wherein the graphene film forms one of the pair of electrodes of each light emitting element.

According to a further aspect, there is provided a method of fabricating a transparent heating device comprising: forming a graphene film having a resistance gradient across the graphene film from a first edge to a second edge of the graphene film; and fixing the graphene film to a transparent substrate.

According to one embodiment, forming the graphene film comprises exposing the graphene film to a solution reactive with graphene to increase the resistivity of the graphene film, wherein a first region of the graphene film is exposed to the reactive solution for less time than a second region of the graphene film.

According to one embodiment, the reactive solution comprises one or more of the following: sodium persulfate; diazonium salt; and nitric acid.

According to a further aspect, there is provided a transparent heating and display device comprising: a transparent heating element formed of a graphene film fixed to a transparent substrate; and a plurality of light-emitting elements each comprising a pair of electrodes, wherein said graphene film forms one of the pair of electrodes of each of the light-emitting elements.

According to one embodiment, the plurality of light-emitting elements are organic light-emitting diodes, and the graphene film directly contacts an organic layer of each of the organic light-emitting diodes.

According to one embodiment, the other of the pair of electrodes of each light-emitting element is coupled via a corresponding conducting track to a control circuit.

According to one embodiment, the transparent heating and display device further comprises: a first electrode connected to a first edge of the graphene film; a second electrode connected to a second edge of the graphene film, wherein a first of the plurality of light-emitting elements is positioned at a first distance from the first electrode and a second of the plurality of light-emitting elements is positioned at a second distance from the first electrode, wherein the control circuit is adapted to generate a first voltage signal for activating the first light-emitting element and a second voltage signal for activating the second light-emitting element, the levels of the first and second voltage signals being selected based on the first and second distances.

According to one embodiment, at least one of the light-emitting elements is an organic light-emitting diode.

According to a further aspect, there is provided a method comprising: forming a transparent heating device comprising a graphene film; and forming a plurality of light-emitting elements, each light-emitting element having a pair of electrodes, wherein the graphene film forms one of the pair of electrodes of each light-emitting element.

BRIEF DESCRIPTION OF THE DRAWINGS

The foregoing and other features and advantages will become apparent from the following detailed description of embodiments, given by way of illustration and not limitation with reference to the accompanying drawings, in which.

It should be noted that, for clarity purposes, the representations of the various layers forming the transparent heating device in the figures have not been drawn to scale.

DETAILED DESCRIPTION OF EMBODIMENTS OF THE PRESENT DISCLOSURE

Figure 1:
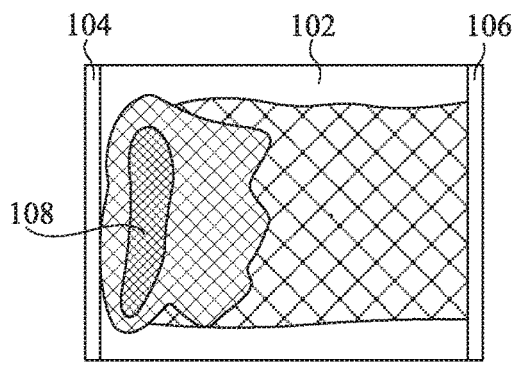
FIG. 1 illustrates an example of non-uniform thermal emission in a graphene device.

FIG. 1 illustrates an example of thermal emission in a graphene field effect transistor, and is based on FIG. 3(a) of the publication entitled "Thermal emission from large area chemical vapor deposited graphene devices", I. J. Luxmoore et al., Applied Physics Letters 103, 131906 (2013), the contents of which is hereby incorporated by reference.

The graphene field effect transistor comprises a graphene mono-layer 102 having dimensions of around 3.5 mm by 3.5 mm. A left-hand edge of the graphene layer 102 is connected to a drain electrode 104, and the right-hand edge of the graphene layer 102 is connected to a source electrode 106. While not illustrated in FIG. 1, the device also comprises a gate electrode.

Thermal emissions in the device are represented by criss-cross shading in FIG. 1, with finer shading indicating higher thermal emissions. The thermal emissions of FIG. 1 correspond to a case in which there is a zero gate bias, and a drain current of 20 mA is applied by connecting the electrode 104 to a supply voltage, and the electrode 106 to a ground voltage. A single large hotspot 108 is observed close to the drain contact. Thermal emission in other zones of the graphene device is relatively low.

It would be desirable to provide a transparent heating device based on graphene that does not suffer from such non-uniform thermal emissions across its surface.

One solution for improving the uniformity of thermal emissions would be to increase the thickness of the graphene layer and/or to add one or more additional conductive layers or a conductive grid to the device. However, such a solution is likely to significantly reduce transparency, which is undesirable in many applications.

Figure 2A:
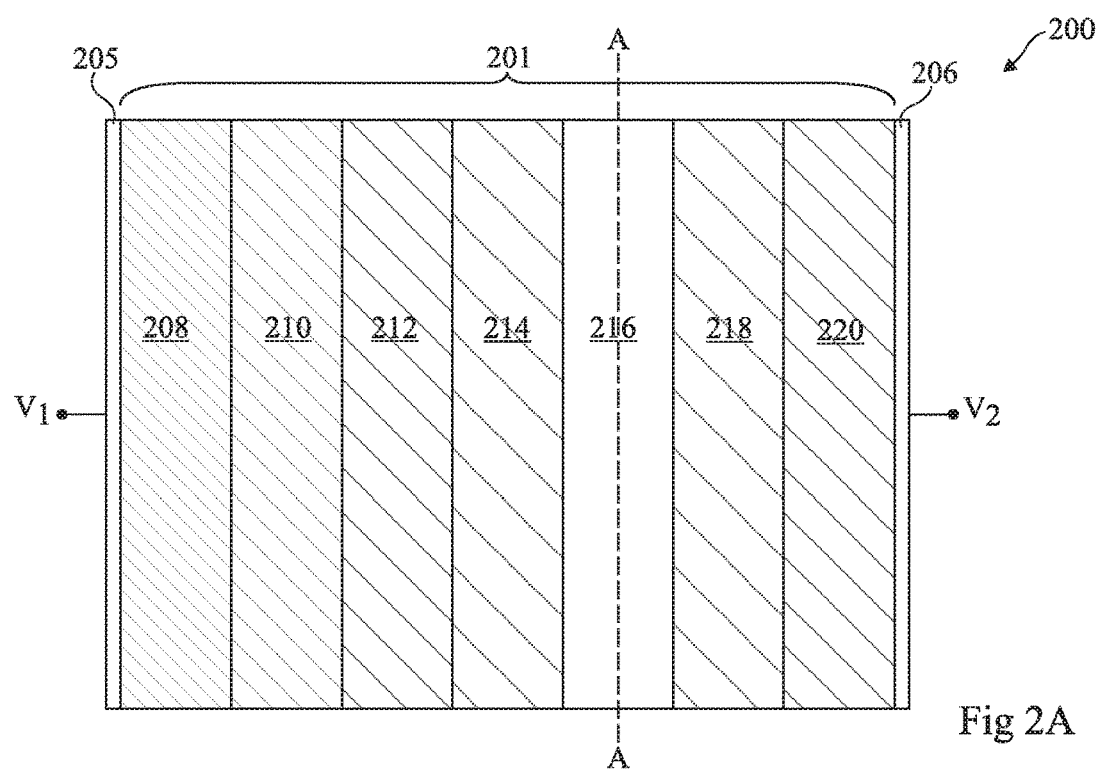
FIG. 2A illustrates, in plan view, a transparent heating device comprising a graphene film according to an embodiment of the present disclosure.

FIG. 2A illustrates, in plan view, a transparent heating device 200 according to an embodiment of the present disclosure. The device 200 comprises a transparent element 201 comprising a graphene film.

Figure 2B:
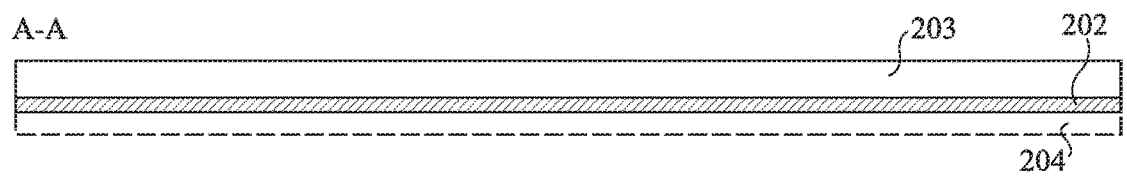
FIG. 2B is a cross-section view of the transparent heating device of FIG. 2A according to one embodiment.

FIG. 2B illustrates a cross-section A-A of the transparent element 201. The transparent element 201 for example comprises a graphene film 202 fixed to a transparent substrates 203, which is for example formed of sapphire, quartz, glass, laminated glass, silicon and/or a transparent polymer, or any other type of transparent material, such as a combination of the above. The graphene film 202 is for example formed of a plurality of graphene mono-layers bonded or otherwise fixed together. For example, each graphene mono-layer has a thickness of around 0.35 nm, and thus the graphene film 202 for example has a thickness of between 0.35 and around 2 nm. In some embodiments, the graphene film 202 is doped in order to reduce its surface resistance, for example using P-dopants such as $AuCl_3$ and/or $HNO_3$. Additionally or alternatively, layers of $FeCl_3$ may be intercalated between one or more of the graphene layers to reduce the element resistance. For example, such a technique is described in more detail in the publication entitled "Novel Highly Conductive and Transparent Graphene-Based Conductors", I. Khrapach et al., Advanced Materials 2012, 24, 2844-2849, the contents of which is hereby incorporated by reference.

Optionally, in the case that the transparent heating device 200 is a mirror such as a wing mirror, the device may further comprises a layer or coating 204 of reflective material. In the example of FIG. 2B, the layer 204 is formed contacting the graphene film 202, but in alternative embodiments it could be formed on the transparent substrate 203, and the graphene film 202 could be an outer layer of the mirror, for example coated by a transparent varnish.

The transparent heating device 200 and graphene film 202 may be flat as shown in FIG. 2B. In alternative embodiments, such as in the case of a car windscreen, the heating device 200 and graphene film 202 may be at least partially curved.

Referring again to FIG. 2A, a left-hand edge of the graphene film is for example electrically connected to an electrode 205 receiving a voltage $V_1$, and a right-hand edge of the graphene film is for example electrically connected to an electrode 206 receiving a voltage $V_2$. In the example of FIG. 2A, the transparent layer 202 is rectangular, but in alternative embodiments it could have other shapes. For example, the transparent device 200 could be a vehicle windscreen or wing mirror, and be shaped accordingly. The transparent element 201 and the graphene film 202 for example have a surface area of at least 1 $cm^2$, and/or the distance separating the electrodes 205 and 206 is equal to at least 10 mm.

The graphene film 202 has a non-uniform resistivity across its surface, in other words a non-uniform resistance per square. For example, there is a resistance gradient across the graphene film 202 from one of the electrodes 205, 206 to the other. In some embodiments, the resistance gradient is one-dimensional, implying that the resistance is substantially constant along one dimension of the graphene film 202. In other embodiments, when the connection of the graphene layer to the electrodes is not along an entire edge, but focused on one or a few points, the resistance gradient is for example made such that it compensates for the spreading of the field lines in order to generate constant or substantially constant Joule heating per surface unit.

The example of FIG. 2A assumes that a DC voltage is applied across the electrodes 205, 206, with $V_1 > V_2$, and in this case the resistivity is for example lowest closest to the electrode 205. In the example of FIG. 2A, the graphene film (202) is formed of seven regions, labelled, from left to right, 208, 210, 212, 214, 216, 218 and 220 respectively. Each region corresponds to a vertical band extending from one side to the other of the graphene film 202, parallel to the electrodes 205, 206, and having a different level of resistivity. The bands for example have resistances per square in the following ranges:

Band 208: between 3 and 5 ohms;
Band 210: between 5 and 7 ohms;
Bands 212 and 220: between 7 and 10 ohms;
Bands 214 and 218: between 10 and 15 ohms;
Band 216: between 15 and 40 ohms.

The overall resistance of the graphene film 202 between electrodes 205 and 206 is for example in the range 5 to 20 ohms, assuming that the graphene film is square, in other words its width and height are equal. In some embodiments, the resistance can be reduced further by providing a coating of silver on the graphene film, for example as described in the publication by R. Chen et al., entitled "Co-Percolating Graphene-Wrapped Silver Nanowire Network for High Performance, Highly Stable, Transparent Conducting Electrodes", Advanced Functional Materials 2013, 23, 5150-5158, the contents of which is hereby incorporated by reference to the extent permitted by the law.

During operation of the transparent heating device 200, the graphene film 202 is for example made to generate heat by passing a current through it. This is for example achieved by coupling the electrode 205 to a positive voltage, for example with $V_1$ in the range of 10 to 40 V, and the electrode 206 to a ground voltage GND, for example with $V_2$ equal to 0 V. Assuming that a voltage of 12 V is applied across the electrodes 205, 206, the power dissipation across the graphene film is for example in the range 1.44 W to 18 W.

In an alternative embodiment, an alternating current (AC) could be applied between the electrodes 205, 206, the voltage signals $V_1$ and $V_2$ for example being of a sinusoidal form, out of phase with each other by 180 degrees. In such a case, the resistance gradient across the graphene film 202 between the electrodes 205, 206 is for example symmetric. For example, the bands 208 and 220 both have a first resistance per square, the bands 210 and 218 both have a second resistance per square higher than the first, the bands 212 and 216 both have a third resistance per square higher than the second, and the band 214 has a fourth resistance per square higher than the third.

An advantage of providing regions of the graphene film having different resistivity is that the presence of a hot spot can be at least partially avoided. Indeed, the current passing through the graphene film being constant, the power dissipation by each region will be a function only of its resistance, and the higher the resistance, the greater the power dissipation, offsetting the phenomenon causing the non-uniform thermal emissions described above in relation to FIG. 1. Furthermore, modifying a graphene film to create a resistance gradient will not significantly reduce its transparency.

The arrangement of FIG. 2A, with seven regions 208 to 220, is merely one example, and it will be apparent to those skilled in the art that in alternative embodiments the graphene film could be divided very differently into regions of varying resistively. In general, in a DC implementation, the graphene film is for example divided into at least two separate regions, the region closest to one of the electrode 205 having a lower resistance per square than the region furthest from the electrode 205. In an AC implementation, the graphene film is for example divided into at least three separate regions, the regions closest to the electrodes 205, 206 having a lower resistance per square than one or more central regions. Alternatively, the graphene film could have a gradually varying resistivity across its surface, for example with a substantially constant resistance gradient.

Figure 3:
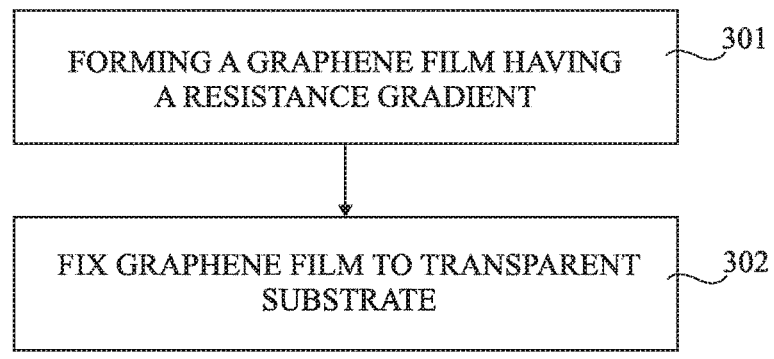
FIG. 3 is a flow diagram illustrating operations in a method of forming a transparent heating device according to an embodiment of the present disclosure.

FIG. 3 is a flow diagram showing steps in a method of forming a transparent heating device.

In a step 301, a graphene film is formed having a resistance gradient. For example, as described above, there is a non-uniform resistivity between different regions of the graphene film.

In a step 302, the graphene film is fixed to a transparent substrate. In some embodiments, edges of the graphene film are also connected to electrodes permitting a voltage to be applied across the graphene film.

The step of forming the graphene film for example involves forming mono-layers of graphene using the apparatus that will now be described with reference to FIG. 4. Such an apparatus is described in more detail in the publication entitled "Homogeneous Optical and Electronic Properties of Graphene Due to the Suppression of Multilayer Patches During CVD on Copper Foils", Z. Han et al., Adv. Funct. Mater., 2013, DOI: 10.1002/adfm.201301732, the contents of which is hereby incorporated by reference.

Figure 4:
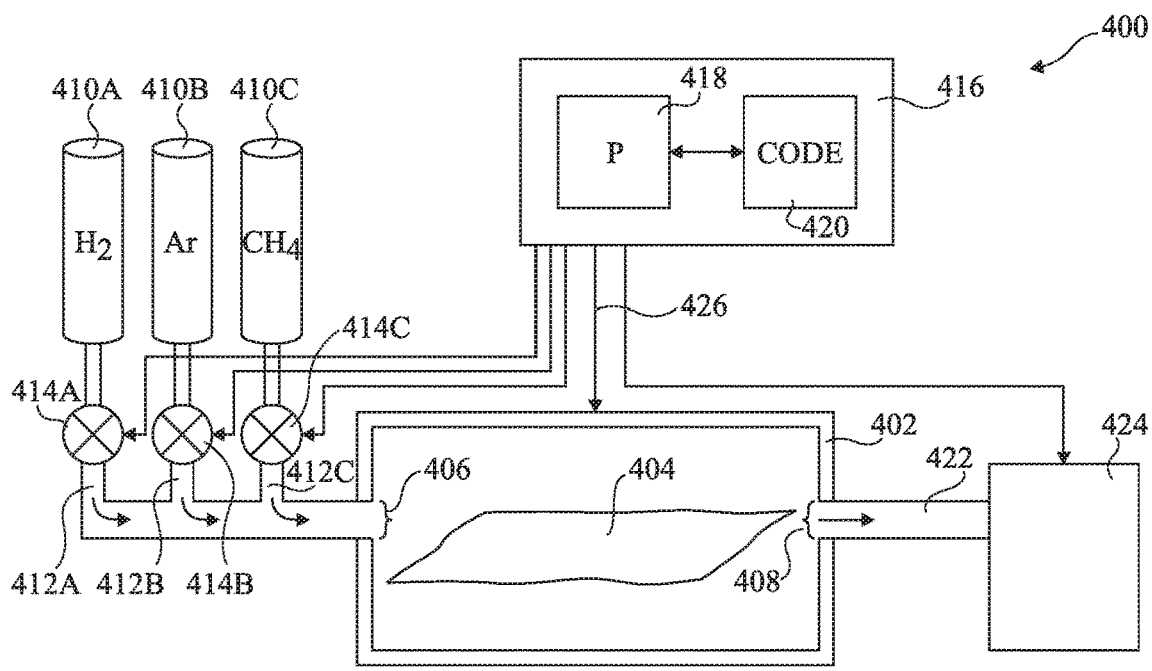
FIG. 4 schematically illustrates an apparatus for forming a graphene mono-layer according to an embodiment of the present disclosure.

FIG. 4 illustrates an apparatus 400 for forming a graphene mono-layer. The apparatus 400 comprises a reaction chamber 402 in which the graphene mono-layer is formed. For example, the reaction chamber 402 is a tube furnace or other type of chamber that can be heated.

A support layer 404, for example formed of copper foil, is placed within the chamber 402. The support layer 404 provides a surface suitable for graphene formation. In particular, the material of the support layer 404 is for example selected as one that provides a catalyst for graphene formation, and for example has relatively low carbon solubility. Other materials that could be used for the support layer 404 include copper alloys such as alloys of copper and nickel, copper and cobalt, copper and ruthenium, other metals such as cobalt, nickel or ruthenium, or dielectric materials, such as zirconium dioxide, hafnium oxide, boron nitride and aluminum oxide. In some embodiments, rather than being a foil, the support layer 404 could be a thin film formed over a substrate, for example a sapphire substrate. The support layer 404 for example has a thickness of between 0.1 and 100 microns.

An inlet 406 of the reaction chamber 402 allows gases to be introduced into the chamber, and an outlet 408 allows gases to be extracted from the chamber. The inlet 406 is for example supplied with gas by three gas reservoirs 410A, 410B and 410C, which in the example of FIG. 4 respectively store hydrogen ($H_2$), argon (Ar), and methane ($CH_4$). In alternative embodiments discussed in more detail below, different gases could be used. In particular, rather than hydrogen, a different etching gas, in other words one that is reactive with carbon, could be used, such as oxygen. Rather than argon, another inert gas could be used, such as helium. This gas is for example used to control the overall pressure in the reaction chamber 402, and could be omitted entirely in some embodiments. Rather than methane, a different organic compound gas could be used, such as butane, ethylene or acetylene.

The inlet 406 is coupled to: reservoir 410A via a tube 412A comprising a valve 414A; reservoir 410B via a tube 412B comprising a valve 414B; and reservoir 410C via a tube 412C comprising a valve 414C. The valves 414A to 414C control the flow rates of the respective gases into the chamber. The valves 414A to 414C are for example electronically controlled by a computing device 416.

The outlet 408 is for example coupled via a tube 422 to an evacuation pump 424 for evacuating gases from the reaction chamber 402. The rate of evacuation by the pump 424 is for example also controlled by the computing device 416. As represented by an arrow 426, the computing device may also control one or more heating elements of the reaction chamber 402 to heat the interior of the chamber during the graphene formation process.

Once a graphene mono-layer has been produced by the apparatus of FIG. 4, it is for example transferred to the transparent substrate 203 of FIG. 2B using a roll-to-roll method, as will now be described with reference to FIG. 5. Such a method is described in more detail in the publication entitled "Roll-to-roll production of 30-inch graphene films for transparent electrodes", S. Bae et al., Nature Nanotechnology, 20 Jun. 2010, the contents of which is hereby incorporated by reference.

Figure 5:
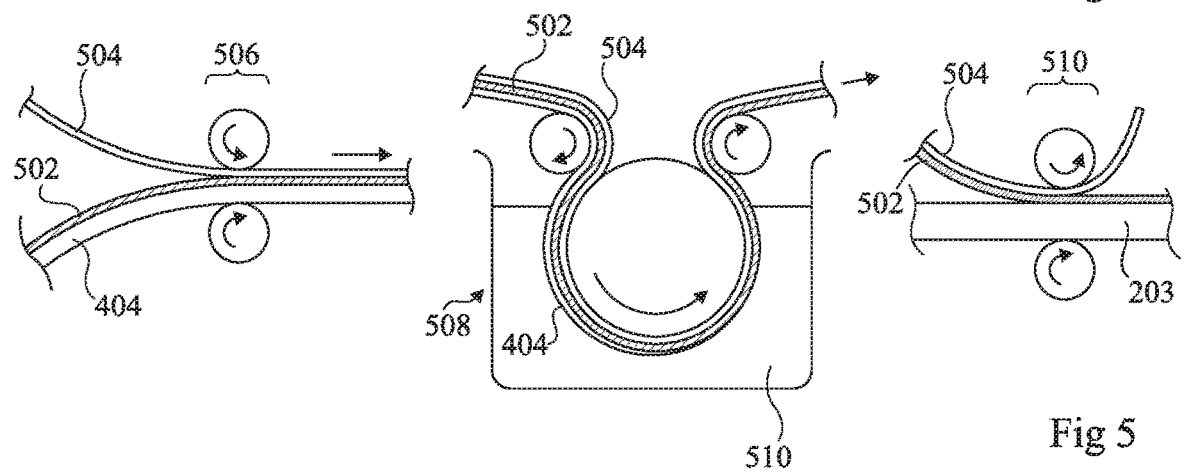
FIG. 5 illustrates steps in a method of transferring a graphene mono-layer to a transparent substrate according to an embodiment of the present disclosure.

FIG. 5 illustrates steps for transferring a graphene monolayer 502 formed on a copper foil 404 onto the transparent substrate 203.

In a first step shown in the left in FIG. 5, the graphene mono-layer 502 is fixed to a polymer layer 504 by passing these layers between a pair of rollers 506. The copper foil 404 is then removed by passing it though a bath 508 of copper etchant 510. The graphene mono-layer 502 is then transferred from the polymer layer 504 to the transparent substrate 203 by passing the layers between another pair of rollers 510.

The difference in resistivity between different regions of the graphene film can achieved by one or more of the techniques that will now be described with reference to FIGS. 6A, 6B, 7, 8 and 9.

Figure 6A:
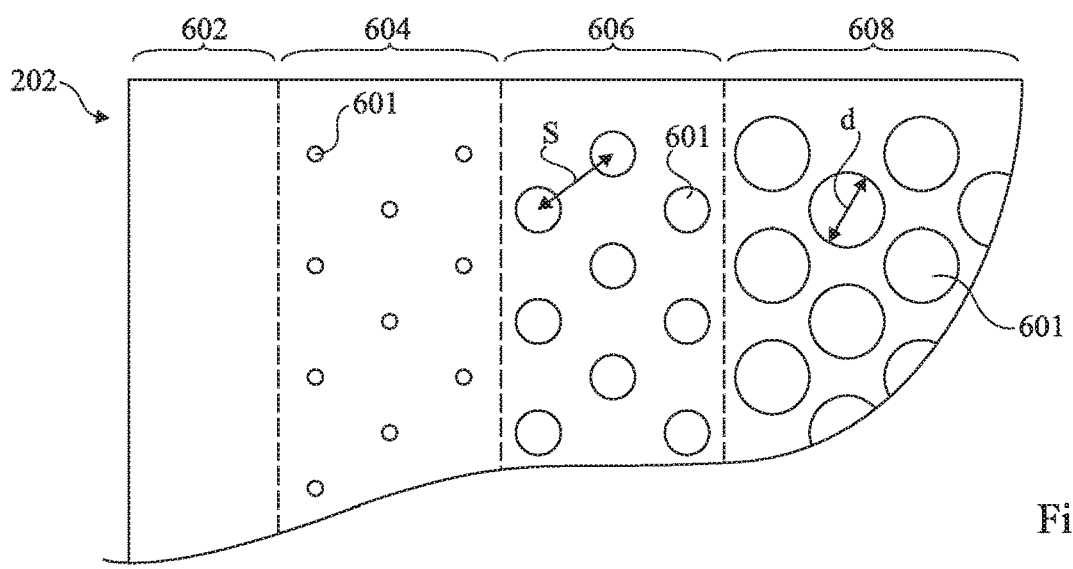
FIG. 6A illustrates a graphene film having openings according to an embodiment of the present disclosure.
Figure 6B:
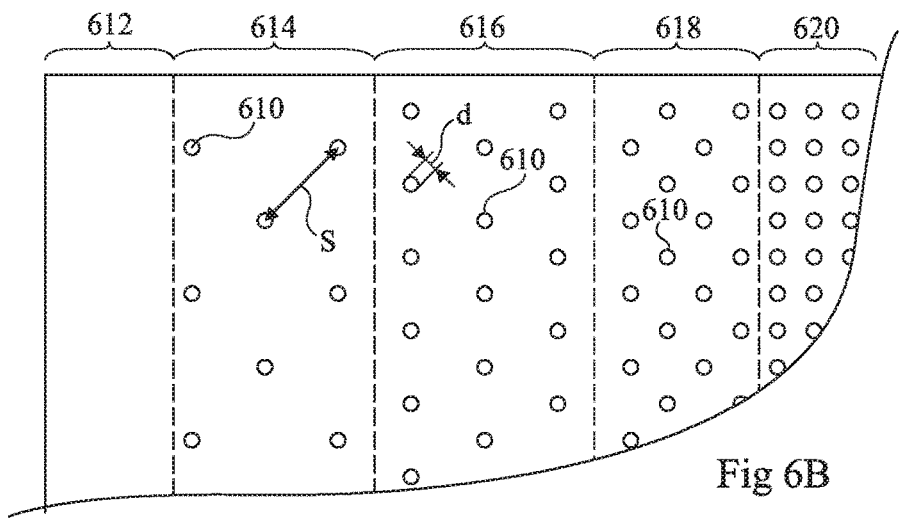
FIG. 6B illustrates a graphene film having openings according to a further embodiment of the present disclosure.
Figure 7:
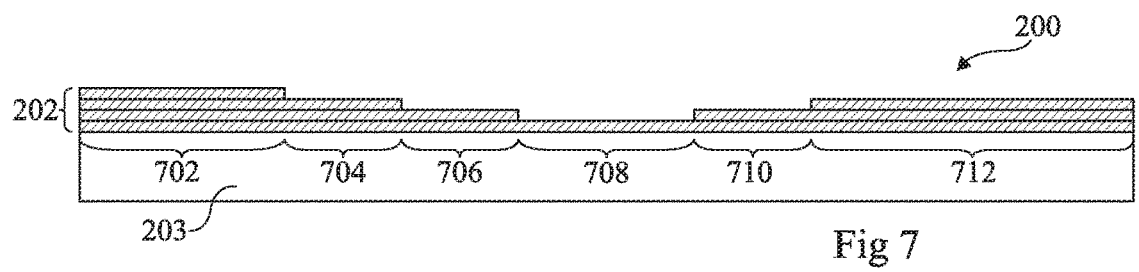
FIG. 7 illustrates a graphene film comprising a plurality of mono-layers having different surface areas according to an embodiment of the present disclosure.

FIGS. 6A, 6B and 7 illustrate examples in which the difference in resistivity between different regions of the graphene film results from differences in the graphene thickness across the graphene film and/or in the surface area of areas of reduced thickness or absence of graphene. In particular, in the examples of FIGS. 6A and 6B, openings are formed through one or more graphene monolayers such that the graphene thickness varies across the graphene film, and the surface area of the openings determines the resistivity. In the example of FIG. 7, different regions of the graphene film comprise a different number of graphene mono-layers, thus resulting in the difference in resistivity between the different regions.

FIG. 6A is a plan view illustrating part of the graphene film 202 in the case that the difference in resistivity results from openings 601 etched through one or more of the graphene mono-layers forming the graphene film 202. In the example of FIG. 6A, a region 602 of the graphene film comprises no openings, whereas regions 604, 606 and 608 all comprise regularly spaced openings 601, the openings getting progressively larger from the region 604 to the region 608. The distance s separating the center of one opening 601 to the next, and/or the diameter d of each opening 601, is for example chosen to be smaller than a minimum value equal for example to around 1 mm, such that the modification to the transparency of the graphene film resulting from the presence of the openings is not visible. In some embodiments, the openings are of smaller dimensions, for example of 1 μm in diameter or less.

FIG. 6B is a plan view illustrating part of the graphene film 202 in the case that the difference in resistivity results from openings 610 etched through one or more of the graphene mono-layers forming the graphene film 202. In the example of FIG. 6B, a region 612 of the graphene film comprises no openings, whereas regions 614, 616, 618 and 620 all comprise openings 610 of the same size, the number of openings getting progressively higher from the region 614 to the region 620. As with in FIG. 6A, the distance s separating the center of one opening 610 to the next, and/or the diameter d of each opening 610, is for example chosen to be smaller than a minimum value equal for example to 1 mm, such that the modification to the transparency of the graphene film resulting from the presence of the openings is not visible. In some embodiments, the openings are of smaller dimensions, for example of 1 μm in diameter or less.

Thus FIGS. 6A and 6B both illustrate examples in which the difference in resistivity among the regions of the graphene film results from areas of reduced thickness and/or absence of graphene. In particular, the graphene film for example comprises openings in which the graphene film is reduced in thickness or is absent entirely. The surface area occupied by these openings determines resistivity of the graphene film in each of the regions. For example, there is a difference in density of openings in the various regions, the higher the density, the higher the resistivity, and/or there is a difference in the surface area of the openings. The openings are for example formed using a photolithography process involving patterning a hard mask and then etching one or more graphene mono-layers of the graphene film 202 in zones not protected by the hard mask using for example oxygen plasma etching.

While the openings 601, 610 in the examples of FIGS. 6A and 6B are round, in alternative embodiments they could have other shapes, including being in the form of lines extending across the graphene film.

FIG. 7 is a cross-section view of the transparent heating device 200 according to an example in which the difference in resistivity between regions of the graphene film 202 results from a difference in the number of mono-layers of graphene in each of the regions. For example, six regions of the graphene film 202 labelled 702 to 712 from left to right in the figure have the following number of stacked graphene mono-layers:

region 702: 4 graphene mono-layers;
region 704: 3 graphene mono-layers;
region 706: 2 graphene mono-layers;
region 708: 1 graphene mono-layer;
region 710: 2 graphene mono-layers; and
region 712: 3 graphene mono-layers.

The structure of FIG. 7 is for example achieved by forming each graphene mono-layer to have a certain surface area, and fixing them one after the other to the transparent electrode 203 using the method described above in relation to FIG. 5.

Of course, FIG. 7 is merely one example, and various different numbers and positioning of the regions, as well as different numbers of mono-layers in each region, would be possible. Furthermore, one or more of the graphene mono-layers may additionally be etched to vary the resistivity according to the method described in relation to FIG. 6A or 6B above.

An advantage of providing the variations in the resistivity of different regions of the graphene film using variations in surface area and/or thickness of areas in which the graphene is reduced in thickness or absent is that such variations result in a very low level of optical effects in the transparent device. Indeed, the thickness of each graphene mono-layer being of only around 0.35 nm, variations in thickness of the graphene film that result in significant changes in its resistivity will always be relatively low, for example always less than around 3 nm. Being far from the wavelength of visible light of 300 to 700 nm, such thickness variations will not introduce visible optical effects other than a certain variation in transparency. On the other hand, other materials such as ITO are much thicker layers, generally of 100 to 300 nm. Thus when the thickness of such materials is varied, this results in undesirable optical effects, such as the effect known as iridescence.

Figure 8:
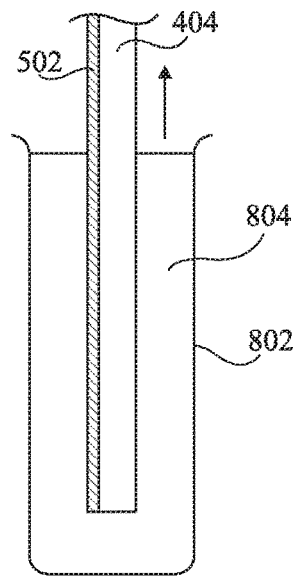
FIG. 8 illustrates a process step for increasing the resistivity of a graphene film according to an embodiment of the present disclosure.

FIG. 8 illustrates a process step for increasing the resistivity of a graphene film using a solution that is reactive with graphene. For example, the graphene mono-layer 502 and copper foil 404 resulting from the method of FIG. 4 described above are dipped in a bath 802 of the reactive solution 804. In one embodiment, the solution 804 comprises sodium persulfate, having the chemical formula $Na_2S_2O_8$, and the solution for example contains sodium persulfate at a concentration of 0.1 g/ml. Alternatively, the solution 804 could comprise diazonium salt and/or nitric acid.

It has been found by the present inventors that the longer that a graphene layer is exposed to such solutions, the higher the density of defects in the layers of graphene, and thus the higher the resistivity. By varying the exposure time of different regions of the graphene layer 202, the resistivity in these regions can thus be varied. One or more graphene mono-layers can be fabricated using this technique, and then fixed one after the other on the transparent substrate 203 in order to form the graphene film 202.

For example, a graphene layer having a resistance gradient from one edge to another could be obtained by at least partially immersing the graphene layer in the bath 802, and then progressively raising the graphene layer out of the bath, as represented in the figure. Alternatively, if it desired to form a graphene layer having a highest resistivity in its central region, an arrangement similar to the one illustrated in FIG. 5 using a bath 508 could be used, in which the etchant 510 is replaced by the reactive solution 804.

Figure 9:
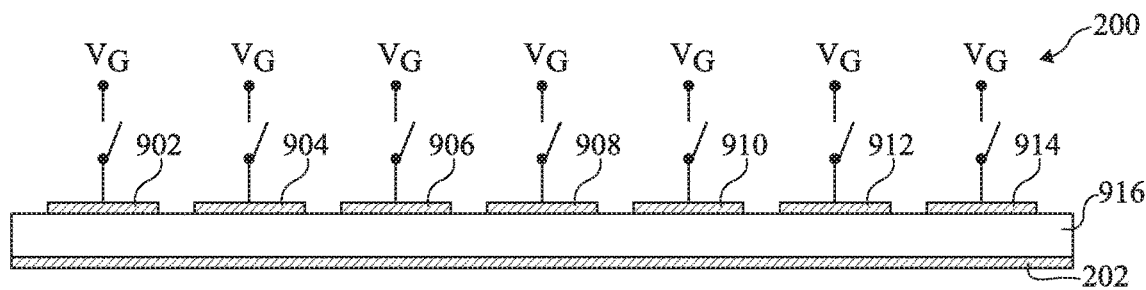
FIG. 9 is a cross-section view schematically illustrating a transparent heating device according to a further embodiment of the present disclosure.

FIG. 9 illustrates yet a further embodiment of the transparent heating device 200 according to an example in which the difference in resistance between regions of the graphene film 202 is achieved by applying different electric fields to each region of the graphene film. As illustrated, seven gate electrodes 902 to 914 are formed parallel to the graphene film 202, and separated from it by an insulating layer 916 for example having a thickness of around 10 to 20 nm. In some embodiments, each gate electrode has a surface area of at least 1 $cm^2$, such that they alter the resistivity of a corresponding surface area of the graphene film. The gate electrodes are for example formed of graphene layers, or by ITO. A gate voltage $V_G$, for example in the range 5 to 10 V, may be applied to each gate electrode via a corresponding switch, and the resistance of the graphene film 202 in the region adjacent to each gate electrode will vary depending on the level of the gate voltage. Thus one or more gate electrodes in a first of the regions for example receive a gate voltage $V_G$ of a first voltage level, and one or more gate electrodes in a second of the regions for example receive a gate voltage $V_G'$ of a second voltage level different to the first voltage level, such that the resistivity of the graphene film is different in the first and second regions.

Figure 10A:
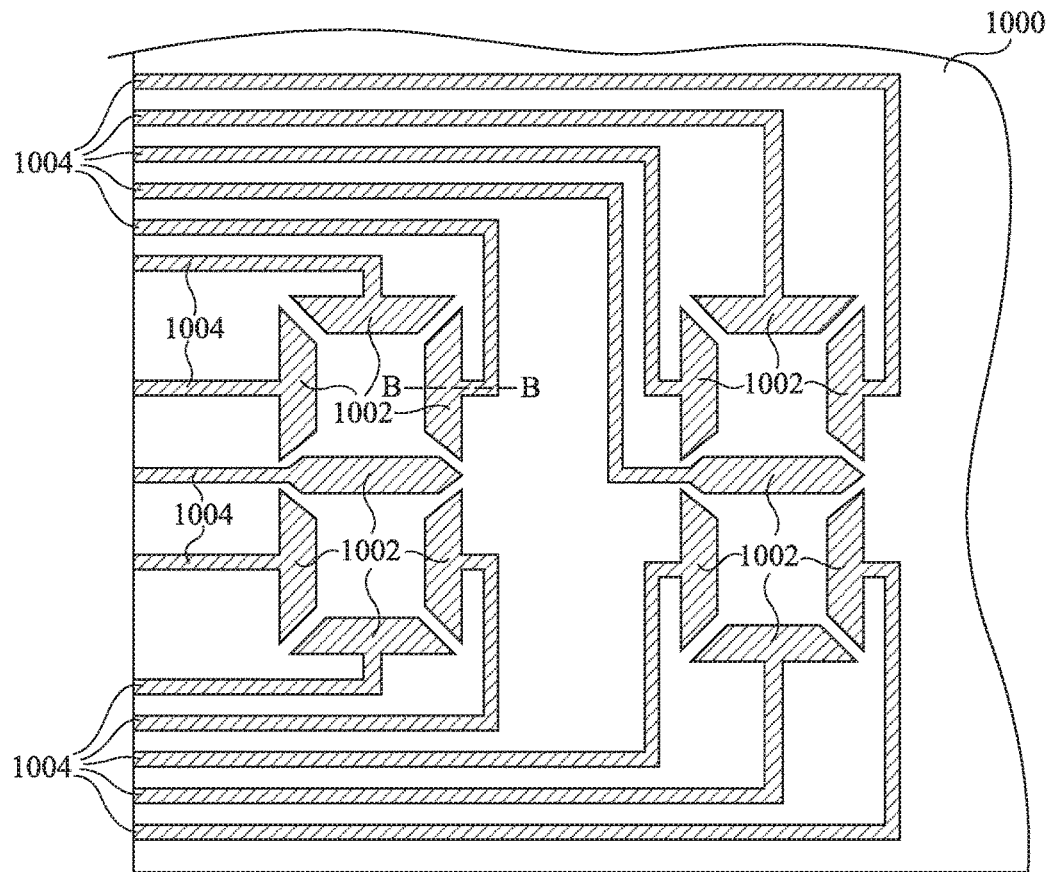
FIG. 10A is a plan view illustrating a transparent heating device comprising light-emitting elements according to an embodiment of the present disclosure.

FIG. 10A is a plan view of part of a transparent heating device 1000 according to an embodiment comprising light-emitting elements 1002, each of which is for example a light-emitting diode (LED), such as an organic LED, or a liquid crystal display (LCD) element. In the example of FIG. 10A, there are 14 light-emitting elements arranged to form the segments of two figure 8's, such that by selectively illuminating certain elements, any two-digit number can be represented. In alternative embodiments, the light-emitting elements 1002 could have other shapes and/or be arranged differently, depending on the information that is to be displayed. For example, the light-emitting elements 1002 could be rectangular pixels formed in an array.

Each of the light-emitting elements 1002 for example comprises an electrode connected by a respective conductive track 1004 to an edge of the device 1000. The light-emitting elements 1002 and conductive tracks 1004 are for example sufficiently transparent and/or spaced apart such that they do not significantly impact the transparence of the device 1000.

Figure 10B:
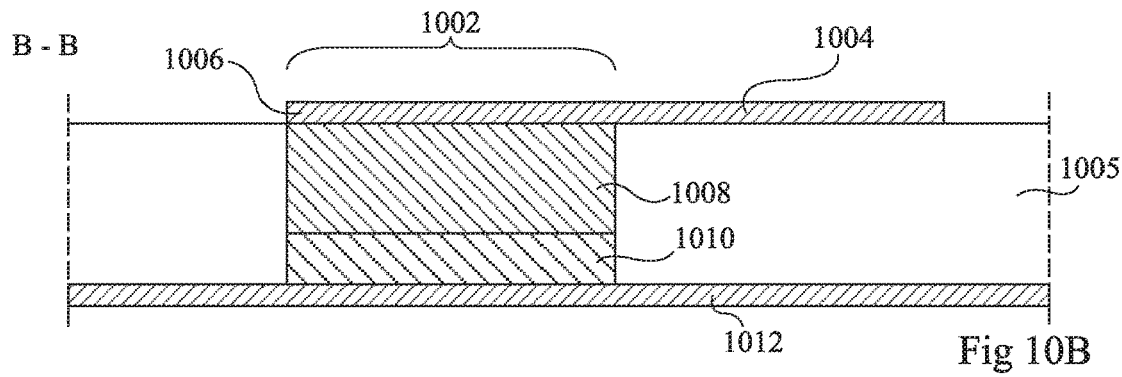
FIG. 10B is a cross-section view of a portion of the device of FIG. 10A according to an embodiment of the present disclosure.

FIG. 10B is a cross-section view of the structure of FIG. 10A, taken along a line B-B of FIG. 10A passing through one of the light-emitting elements 1002 and a portion of a conductive track 1004. Each of the elements 1002 for example has a similar structure.

FIG. 10B illustrates the case that the element 1002 is an organic light-emitting diode (OLED). An OLED having a similar structure is for example described in more detail in the publication entitled "Extremely efficient flexible organic light-emitting diodes with modified graphene anode", T. Han et al., Nature Photonics, VOL 6, February 2012, the contents of which is hereby incorporated by reference.

The conductive track 1004 is for example formed of a transparent conductive layer of graphene or ITO, which also forms a patterned electrode 1006 on the top of a stack forming the light-emitting element 1002. The conductive track 1004 is for example formed on a transparent substrate 1005, for example similar to the substrate 203 described above, and in which the light-emitting elements 1002 are formed.

The stack forming the light-emitting element 1002 for example comprises an organic light-emitting layer 1008 and, optionally, an organic work function adjustment layer 1010. The stack may also comprise one or more further layers not illustrated in FIG. 10B.

The transparent heating device 1000 also comprises a heating element formed of a graphene film 1012, for example formed on a side of the transparent substrate 1005 opposite to the side on which the conductive tracks 1004 are formed. The transparent heating element 1012 is heated by passing a current through it. In some embodiments, the graphene film 1012 is of uniform resistivity, while in alternative embodiments it could have a resistance gradient like the graphene film 202 described above.

As illustrated in FIG. 10B, the graphene film 1012 is formed in direct contact with one of the organic layers 1008, 1010 of the organic light-emitting diode. In the example of FIG. 10B, the graphene film 1012 directly contacts the organic work function adjustment layer 1010, although in alternative embodiments, this layer could be omitted, or placed in contact with the electrode 1006, and the graphene film 1012 could directly contact the organic light-emitting layer 1008. In either case, the graphene film 1012 thus forms an electrode of the light-emitting element.

An advantage of forming light-emitting elements with the graphene film 1012 forming one of their electrodes is that the thickness of the light-emitting elements can be reduced when compared to a case in which the light-emitting element has itself an electrode, which is then connected to the graphene film 1012. Furthermore, it may be desirable that the transparent heating and display device 1000 is highly transparent. By using the graphene film 1012 as one of the electrodes of the light-emitting element, relatively high transparency can be achieved. For example, in the case that the light-emitting element is an organic light-emitting diode, this diode can be formed of only organic layers, such as the layers 1008 and 1010 described above, and of graphene layers, such as the layers 1012 and 1006, and can thus have very high transparency.

Operation of the transparent heating device will now be described with reference to FIG. 11.

Figure 11:
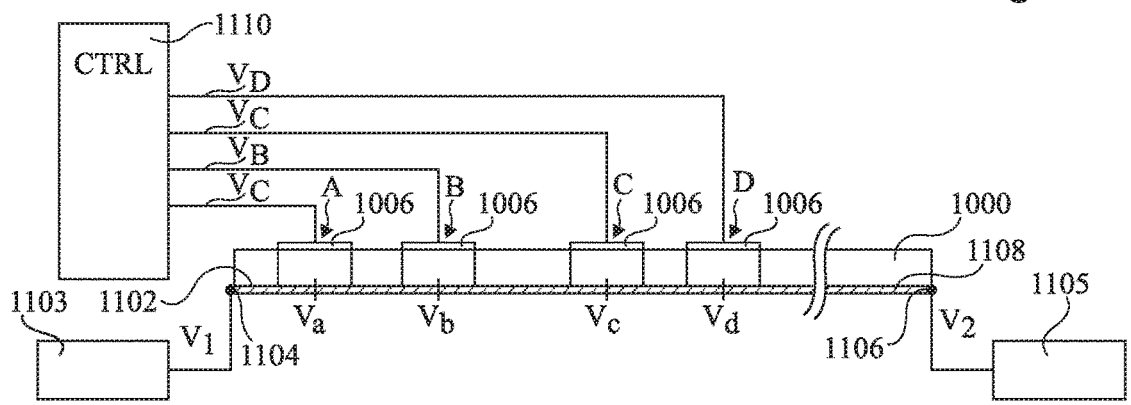
FIG. 11 schematically illustrates a system for controlling a transparent heating and display device.

FIG. 11 schematically illustrates a system 1100 for controlling the transparent heating and display device 1000, which is represented in cross-section in FIG. 11. Four of the light-emitting elements, labelled A, B, C and D, are illustrated in FIG. 11, at varying distances from an edge 1202 of the device 1000.

Each of the light-emitting elements A to D is for example activated by a voltage difference applied between the graphene film 1012 and its top electrode 1006. The voltage level applied to the top electrode 1006 is for example chosen in order to create the desired voltage difference and is for example a function of the distance between the light-emitting element 1006 and the edge 1102 of the graphene film 1012 at which the voltage is applied.

In particular, as shown in FIG. 11, a voltage $V_1$ is for example applied, by a drive circuit 1103, to an electrode 1104 connected to the edge 1102 of the graphene film 1012. If the graphene film 1012 is to be heated, a voltage $V_2$ is also for example applied, by a drive circuit 1105, to an electrode 1106 connected to the other edge 1108 of the graphene film 1012. In view of the resistance per square of the graphene film 1012, the voltage applied to the electrode 1104 will cause a certain voltage level at each light-emitting element, these voltage levels being labelled $V_a$ to $V_d$ in FIG. 11 for the elements A to D respectively. These voltage levels $V_a$ to $V_d$ will depend on the resistance between the electrode 1104 and the corresponding light-emitting element 1002, which is a function of the distance.

A control circuit (CTRL) 1110 for example generates voltage levels $V_A$ to $V_D$ applied to the top electrodes 1006 of the light-emitting elements A to D respectively, via corresponding conductive tracks, to selectively activate one or more of the elements. For example, assuming that each light-emitting element is activated by a voltage difference of 2 V applied across its electrodes, and that the voltages $V_a$, $V_b$, $V_c$ and $V_d$ are 11 V, 10 V, 9 V and 8 V respectively, to activate the element A, the voltage $V_A$ is for example set to 9 V, to activate the element B, the voltage $V_B$ is for example set to 8 V, to activate the element C, the voltage $V_C$ is for example set to 7 V, and to activate the element D, the voltage $V_D$ is set to 6 V.

An advantage of the embodiments of FIGS. 2A to 9 is that, by providing a graphene film having a resistance gradient across its surface, the transparent heating device has thermal emissions with improved uniformity, while maintaining a relatively high transparency of the heating device.

An advantage of the embodiments of FIGS. 10A to 11 is that a transparent heating device is provided that has integrated light-emitting elements while maintaining a relatively high transparency.

Having thus described at least one illustrative embodiment of the invention, various alterations, modifications, and improvements will readily occur to those skilled in the art. For example, the various features described in relation to the various embodiments could be combined, in alternative embodiments, in any combination.

Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. A transparent heating device comprising:
   a graphene film fixed to a transparent substrate;
   a first electrode connected to a first edge of the graphene film; and
   a second electrode connected to a second edge of the graphene film, wherein there is a resistance gradient across the graphene film from the first electrode to the second electrode, the graphene film comprising a first region adjacent to the first electrode and at least one further region, the first region being adapted to have a lower resistance per square than each of the at least one further regions, the graphene film comprising areas of reduced thickness and/or absence of graphene, the lower resistance per square in the first region with respect to the at least one further region resulting from the surface area and/or thickness of said areas of reduced thickness and/or absence of graphene.

2. The transparent heating device of claim 1, wherein the areas of reduced thickness and/or absence of graphene comprise openings formed in one or more graphene mono-layers of the graphene film in the at least one further region.

3. The transparent heating device of claim 2, wherein the first region comprises openings formed in one or more graphene mono-layers of the graphene film, and wherein the density of openings and/or the surface area of the openings is greater in the at least one further region than in the first region.

4. The transparent heating device of claim 3, wherein the first region comprises a plurality of graphene mono-layers, and wherein the at least one further region comprises fewer graphene mono-layers than the first region.

5. The transparent heating device of claim 2, wherein the first region comprises a plurality of graphene mono-layers, and wherein the at least one further region comprises fewer graphene mono-layers than the first region.

6. The transparent heating device of claim 1, wherein the first region comprises a plurality of graphene mono-layers, and wherein the at least one further region comprises fewer graphene mono-layers than the first region.

7. The transparent heating device of claim 1, further comprising a display comprising one or more light emitting elements each having a pair of electrodes, wherein the graphene film forms one of the pair of electrodes of each light emitting element.

8. A transparent heating device comprising:
a graphene film fixed to a transparent substrate;
a first electrode connected to a first edge of the graphene film;
a second electrode connected to a second edge of the graphene film, wherein there is a resistance gradient across the graphene film from the first electrode to the second electrode, the graphene film comprising a first region adjacent to the first electrode and at least one further region, the first region being adapted to have a lower resistance per square than each of the at least one further regions; and
one or more gate electrodes positioned in the at least one further regions and isolated from the graphene film by an insulating layer, a voltage applied to the one or more gate electrodes increasing the resistance per square of the graphene film in the at least one further regions.

9. The transparent heating device of claim 8, wherein each of the one or more gate electrodes has a surface area of at least 1 cm$^2$.

10. The transparent heating device of claim 8, comprising a plurality of said further regions, a first of said gate electrodes being positioned in a first of said further regions and a second of said gate electrodes being positioned in a second of said further regions.

11. The transparent heating device of claim 10, further comprising a control circuit adapted to apply a first voltage to the first gate electrode and a second voltage different from the first voltage to the second gate electrode.

12. The transparent heating device of claim 8, further comprising a display comprising one or more light emitting elements each having a pair of electrodes, wherein the graphene film forms one of the pair of electrodes of each light emitting element.

13. A transparent heating and display device comprising:
a transparent heating element formed of a graphene film fixed to a transparent substrate;
a plurality of light-emitting elements each comprising a pair of electrodes, wherein said graphene film forms one of the pair of electrodes of each of the light emitting elements;
a first electrode connected to a first edge of the graphene film; and
a second electrode connected to a second edge of the graphene film,
wherein there is a resistance gradient across the graphene film from the first electrode to the second electrode, the graphene film comprising a first region adjacent to the first electrode and at least one further region, the first region being adapted to have a lower resistance per square than each of the at least one further regions, and wherein,
the graphene film comprising areas of reduced thickness and/or absence of graphene, the lower resistance per square in the first region with respect to the at least one further region resulting from the surface area and/or thickness of said areas of reduced thickness and/or absence of graphene, or
one or more gate electrodes are positioned in the at least one further regions and isolated from the graphene film by an insulating layer, a voltage applied to the one or more gate electrodes increasing the resistance per square of the graphene film in the at least one further regions.

14. The transparent heating and display device of claim 13, wherein the plurality of light-emitting elements are organic light-emitting diodes, and wherein the graphene film directly contacts an organic layer of each of the organic light-emitting diodes.

15. The transparent heating and display device of claim 14, further comprising:
a first electrode connected to a first edge of the graphene film; and
a second electrode connected to a second edge of the graphene film, wherein there is a resistance gradient across the graphene film from the first electrode to the second electrode.

16. The transparent heating and display device of claim 13, wherein the other of the pair of electrodes of each light-emitting element is coupled via a corresponding conducting track to a control circuit.

17. The transparent heating and display device of claim 16, further comprising:
a first electrode connected to a first edge of the graphene film;
a second electrode connected to a second edge of the graphene film,
wherein a first of the plurality of light-emitting elements is positioned at a first distance from the first electrode and a second of the plurality of light-emitting elements is positioned at a second distance from the first electrode, wherein the control circuit is adapted to generate a first voltage signal (VA) for activating the first light-emitting element and a second voltage signal (VB) for activating the second light-emitting element (B), the levels of the first and second voltage signals being selected based on the first and second distances.

18. The transparent heating and display device of claim 13, wherein at least one of the light-emitting elements is an organic light-emitting diode.

19. A method comprising:
forming a transparent heating device comprising a graphene film;

forming a plurality of light-emitting elements, each light-emitting element having a pair of electrodes, wherein the graphene film forms one of the pair of electrodes of each light-emitting element; and forming a first electrode connected to a first edge of the graphene film and a second electrode connected to a second edge of the graphene film, wherein there is a resistance gradient across the graphene film from the first electrode to the second electrode, the graphene film comprising a first region adjacent to the first electrode and at least one further region, the first region being adapted to have a lower resistance per square than each of the at least one further regions, and wherein, the graphene film comprising areas of reduced thickness and/or absence of graphene, the lower resistance per square in the first region with respect to the at least one further region resulting from the surface area and/or thickness of said areas of reduced thickness and/or absence of graphene, or one or more gate electrodes are positioned in the at least one further regions and isolated from the graphene film by an insulating layer, a voltage applied to the one or more gate electrodes increasing the resistance per square of the graphene film in the at least one further regions.

* * * * *